United States Patent
Troost

(10) Patent No.: US 7,250,659 B2
(45) Date of Patent: Jul. 31, 2007

(54) SEMICONDUCTOR COMPONENT WITH ESD PROTECTION

(75) Inventor: Marco Troost, Passau (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/623,815

(22) Filed: Jul. 21, 2003

(65) Prior Publication Data

US 2004/0056339 A1  Mar. 25, 2004

Related U.S. Application Data

(63) Continuation of application No. PCT/DE02/00175, filed on Jan. 21, 2002.

(30) Foreign Application Priority Data

Jan. 19, 2001 (DE) ............................... 101 02 354

(51) Int. Cl.
  *H01L 23/62* (2006.01)
  *H01L 29/74* (2006.01)
  *H01L 23/495* (2006.01)

(52) U.S. Cl. ............... 257/355; 257/173; 257/676; 257/738

(58) Field of Classification Search ............... 257/173, 257/666, 355–357, 676
See application file for complete search history.

(56) References Cited

U.S. PATENT DOCUMENTS 5,079,612 A * 1/1992 Takamoto et al. .......... 257/360
5,416,660 A * 5/1995 Shiga .......................... 361/111
5,426,323 A    6/1995 Reczek et al.
5,455,453 A * 10/1995 Harada et al. ............... 257/675
5,646,434 A    7/1997 Chrysostomides et al.
5,821,804 A   10/1998 Nikutta et al.
5,886,862 A    3/1999 Anderson et al.
5,917,362 A *  6/1999 Kohama ...................... 327/408
6,476,486 B1 * 11/2002 Humphrey et al. .......... 257/738

FOREIGN PATENT DOCUMENTS

| DE | 195 07 313 A1 | 9/1996 |
| EP | 0 412 561 A2 | 2/1991 |
| EP | 0 623 958 A1 | 11/1994 |
| EP | 0 736 904 A1 | 10/1996 |
| JP | 03156965 | 7/1991 |
| JP | 10022448 | 1/1998 |

* cited by examiner

*Primary Examiner*—Ori Nadav
(74) *Attorney, Agent, or Firm*—Laurence A. Greenberg; Werner H. Stemer; Ralph E. Locher

(57) ABSTRACT

The semiconductor component has ESD protective elements configured outside the semiconductor body. The ESD protective elements connect an additional conductor track that carries a reference potential to conductor tracks of the leadframe. ESD protective structures integrated on the semiconductor body are no longer required. The correspondingly high area consumption is avoided.

12 Claims, 1 Drawing Sheet

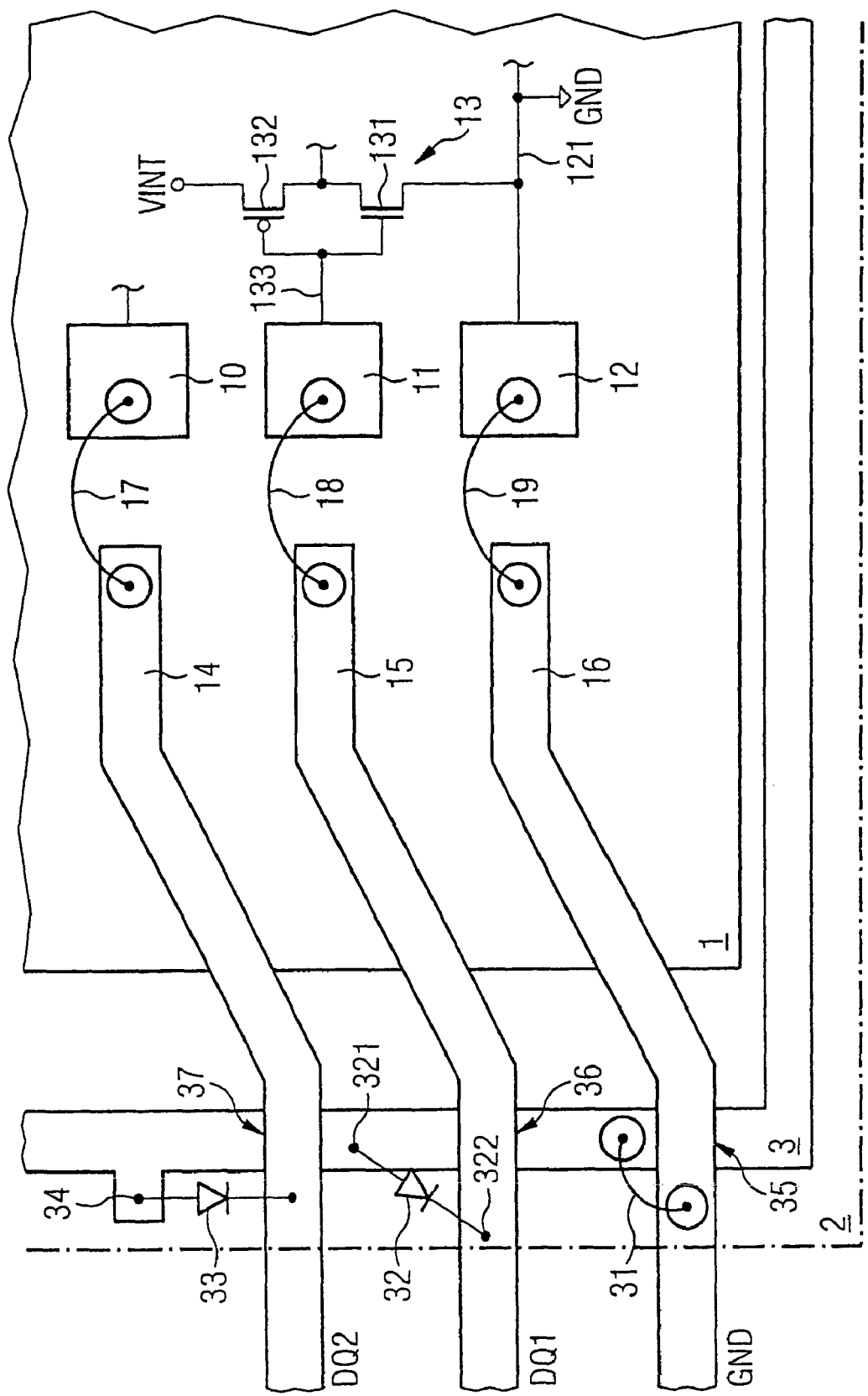

SEMICONDUCTOR COMPONENT WITH ESD PROTECTION

CROSS-REFERENCE TO RELATED APPLICATION

This application is a continuation of copending International Application No. PCT/DE02/00175, filed Jan. 21, 2002, which designated the United States and was not published in English.

BACKGROUND OF THE INVENTION

Field of the Invention

The invention relates to a semiconductor component having an electronic circuit and an electrostatic discharge device for carrying electrostatic discharges away from a terminal connected to an input stage or an output stage of the electronic circuit.

Integrated circuits are externally fed supply potentials and input signals to be processed and have processed output signals picked off from them. In particular, the input signal terminals are very sensitive, since the conductor tracks serving for feeding the potentials and signals lead directly to a gate terminal of an input switching stage. When manually handling the integrated circuit or during the automated further processing to place the integrated circuit on a circuit board and solder it, there is the risk that the sensitive input stage or output stage can be destroyed because of the discharge of electrostatic charges. For instance, the human body may be electrostatically charged, which charges are then discharged via the terminals led to the outside of the semiconductor component containing the integrated circuit. Tools of automatic component-mounting machines or test equipment may also be electrostatically charged and discharged via the semiconductor component. With ever smaller pattern line widths on the semiconductor body bearing the integrated circuit, there is a necessity to protect against such electrostatic discharges.

U.S. Pat. No. 5,646,434 shows exemplary embodiments for protective elements against electrostatic discharges, known as ESD (electrostatic discharge) protective elements. The input terminal is connected to a reference potential (ground) via an ESD protective structure, which substantially has a diode characteristic. The ESD protective structure is formed entirely in the semiconductor body. The protective structure is in this case dimensioned in such a way that, when signals to be processed that are within the prescribed specification are applied, it does not switch and attenuates the signal waveforms as little as possible. The diode characteristic must therefore have a high breakdown voltage. On the other hand, it must be ensured that, in the event of an electrostatic discharge, the amount of charge is carried away to ground in a state of low impedance. The diodes used or transistors connected as diodes must be dimensioned over a large surface area in order to have a correspondingly high current-carrying capacity. It is therefore disadvantageous that the ESD protective structures require a high area consumption in the semiconductor body in order to meet the set boundary conditions for a high breakdown voltage and a high current-carrying capacity.

Another semiconductor circuit with protective elements against electrostatic discharges is shown in Published European Patent Application EP 0 736 904 A1. There, protective elements are arranged between a terminal pad and conductor tracks running on the semiconductor chip. Certain portions of the conductor tracks run parallel to the edge of the semiconductor chip. One of the conductor tracks forms a ring around the semiconductor chip.

SUMMARY OF THE INVENTION

It is accordingly an object of the invention to provide a semiconductor component with which the area consumption in the semiconductor body is as small as possible, but ESD protection is nevertheless adequately ensured.

With the foregoing and other objects in view there is provided, in accordance with the invention, a semiconductor component with a semiconductor body including an electronic circuit configured therein. The electronic circuit has a terminal for a signal to be processed. The electronic circuit has a stage connected to the terminal for the signal. The electronic circuit has a terminal for obtaining a supply potential. The terminal for obtaining the supply potential is connected to the stage. The stage is either an input stage or an output stage. A first conductor track runs outside the semiconductor body. The first conductor track is connected to the terminal for the signal. A second conductor track runs outside the semiconductor body. The second conductor track is connected to the terminal for obtaining the supply potential. The semiconductor component also includes an element for carrying an electrostatic discharge away from the terminal for the signal and to the supply potential. The semiconductor component also includes a further conductor track running outside the semiconductor body. The further conductor track is connected to the second conductor track. The element for carrying the electrostatic discharge is disposed outside of the semiconductor body. The element for carrying the electrostatic discharge is connected outside of the semiconductor body to the further conductor track and to the first conductor track.

In the case of the inventive semiconductor component, the ESD elements are no longer formed in the semiconductor body. As set out above, an integrated configuration of ESD protective structures takes up a not inconsiderable amount of surface area. This area consumption is saved in the case of the inventive semiconductor component. Instead of this, the ESD protective elements are arranged outside the semiconductor body. In addition, a further conductor track is provided, which carries a supply potential, preferably ground, and is led past those conductor tracks via which the input or output signals are input or output to or from the functional units of the semiconductor body. The invention is suitable both for discrete-value input and output stages operating on a digital basis and for continuous-value input and output stages operating on an analog basis. In addition, it is advantageous that the ESD protective element arranged outside the semiconductor body can now be made larger than in the case of an integrated configuration. The ESD resistance is increased as a result.

Provided in the integrated semiconductor chip are so-called terminal pads, i.e. areas of metallization which represent the input or output terminals of the integrated circuit. Metallic conductor tracks that are outside the semiconductor body carry supply potentials and signals to be processed in and away. These conductor tracks are provided as a so-called leadframe. The ends of the conductor tracks of the leadframe assigned to the semiconductor body are then brought into contact with the terminal pads by bonding wires. The opposite ends of the conductor tracks of the leadframe are the terminal pins of the semiconductor component and are soldered on a circuit board or inserted into a socket. The semiconductor body is surrounded by a package, usually made of plastic. The conductor tracks of the leadframe are led to the outside in order to establish contact with the circuit board.

The further conductor track that is additionally provided surrounds the semiconductor body. The semiconductor body is usually made in a rectangular form. At least part of the further conductor track then runs parallel to the edges of the semiconductor body. It thereby crosses the conductor tracks, which are for the signals to be processed and for the supply potentials, of the leadframe that are led from the terminal pads to the outside through the package.

The connection between a conductor track of the lead frame carrying the supply potential (ground) and the conductor track additionally surrounding the semiconductor body is preferably established by a bonding connection. The additional conductor track carrying ground potential is connected at crossing points via the ESD protective element to a conductor track of the leadframe carrying a signal to be processed. The ESD protective element is preferably a diode, the anode terminal of which is connected to the additional conductor track and the cathode of which is connected to the conductor track carrying the signal to be processed. Instead of a pn diode, a MOS diode may also be used. In this case it is a MOS field-effect transistor, the source and gate terminals of which are connected to each other.

At the crossing points of the further conductor track carrying ground potential and conductor tracks carrying signals to be processed, insulations are provided, so that the two conductor tracks are electrically insulated from each other and a short-circuit between the signal-carrying conductor track of the leadframe and the further crossing conductor track is avoided.

In the vicinity of the crossing locations, the further conductor track may have a short portion branching away from its main running direction. The portion expediently runs in the direction toward the semiconductor body or in the opposite direction away from the semiconductor body. This branch serves as a contact area for the anode of the ESD protective diode.

In the semiconductor body, for example, a silicon substrate, the functional units are configured as bipolar, MOS or CMOS circuits. An input stage may comprise an inverter. The input terminal of the inverter is formed by the coupled gate terminals of its complementary MOS transistors and is connected to the assigned terminal pad. The source terminal of the n-channel MOS transistor of the inverter is connected to reference potential ground. Reference potential ground is connected to a signal line in the semiconductor body that leads to that terminal pad that is supplied by the conductor track carrying the reference potential, which for its part is in turn connected to the further conductor track, crossing the conductor tracks of the leadframe.

Other features which are considered as characteristic for the invention are set forth in the appended claims.

Although the invention is illustrated and described herein as embodied in a semiconductor component with ESD protection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a plan view of an embodiment of a semiconductor component according to the invention.

DESCRIPTION OF THE PREFERRED EMBODIMENTS

Referring now to the single drawing FIGURE, there is shown a semiconductor body 1 with an integrated circuit formed therein. A portion of the integrated circuit, namely a CMOS input switching stage 13, is shown. The input switching stage 13 includes two complementary MOS transistors 131, 132 having their drain-source paths connected in series. The p-channel MOS transistor 132 is supplied by the positive supply potential VINT, and the source terminal of the n-channel MOS transistor 131 is supplied by reference potential GND. The reference potential GND is distributed through a line 121 on the semiconductor chip. All the signals and supply potentials are brought to the semiconductor body through terminal pads 10, 11, 12. The terminal pads are areas of metallization. The terminal pads 10, 11 serve for the input or output of data signals DQ2 and DQ1, respectively. The terminal pad 12 serves for the feeding of ground potential GND. The semiconductor chip is hermetically enclosed in a package 2. The signal traffic and the feeding of supply voltage to the outside takes place via metallic conductor tracks 14, 15, 16. The ends of the conductor tracks 14, 15, 16 near the chip are connected to the assigned terminal pads 10, 11 and 12, respectively, via bonding wires 17, 18 and 19, respectively. The conductor tracks 14, 15, 16 run away from the semiconductor body or chip 1 and through the package 2. The ends of the metallic conductor tracks 14, 15, 16 on the outside of the package are inserted, for example, into a socket or are soldered on a circuit board. The conductor tracks 14, 15, 16 are originally grouped together to form a leadframe, the outside ends being connected to one another. The connection is punched away after the encapsulation in the package 2.

According to the invention, a further metallic conductor track 3 is provided. Like the conductor tracks 14, 15, 16 of the leadframe, the conductor track 3 runs outside the semiconductor body or chip 1. By contrast with the conductor tracks 14, 15, 16 of the leadframe, the conductor track 3 does not run away from the chip but runs parallel to the sides of the semiconductor body 1. The conductor track 3 expediently runs around the semiconductor body 1 and runs parallel to the sides of the semiconductor body forming a closed ring. The further conductor track 3 carries ground potential GND. For this purpose, the conductor track 3 is connected to the ground conductor track 16 of the leadframe by a bonding wire 31 configured near the crossing point of the ground conductor track 16 and the conductor track 3. Alternatively, some other connection by which the mutually opposite surfaces of the lines 16, 3 are connected to each other may be used, for example, a conductive adhesive. Ground potential GND is provided through the line 3 around the semiconductor chip 1.

The additional conductor track 3 also crosses the conductor tracks 14, 15 of the leadframe carrying the signals DQ1, DQ2. Provided at the crossing locations are ESD elements 32, 33, which are connected between the conductor track 3 and the relevant one of the conductor tracks 14, 15. For instance, the anode of a diode 32 is connected at the point 321 to the conductor track 3 and at the point 322 to the conductor track 15. The diode 32 serves as an ESD protective element. It has a high breakdown voltage in order not to exert any load on the signal DQ1 that lies within the specification. However, in the case of a high electrostatic voltage, the diode 32 breaks down and is of a high enough rating for sufficient charge to be able to flow away from the conductor track 15 via the contact points 322, 321 to the conductor track 3 and further via the bonding wire 31 to the ground conductor track 16. As a result, the gate oxide at the transistor 131 of the inverter 13 is protected from breakdown. By contrast with ESD protective structures arranged on the semiconductor body, which would have to be arranged between the input line 133 and the line 121 for ground potential GND, the ESD protective diode 32 does not take up any area on the semiconductor body. The area consumption would be not inconsiderable, since a high breakdown voltage along with adequate current-carrying capacity would have to be achieved.

The conductor track 14 for the signal DQ2 to be processed is connected to the ring conductor track 3 via another ESD protective diode 33. In the vicinity of the crossing point of conductor track 14 with conductor track 3, there is provided a branch 34 of the conductor track 3, which runs parallel to the corresponding portion of the conductor track 14. In the exemplary embodiment, the branch 34 is directed to the outside; it may alternatively also be directed to the inside toward the semiconductor body 1. The branch 34 is so far away from the crossing point that the anode of the ESD protective diode contacts the branch 34 and the cathode contacts the conductor track 14.

In the exemplary embodiment shown, the signal DQ1 is one which is to be input into the circuit on the semiconductor body 1. The signal DQ2 is for example one which is to be output from the circuit. In this case, the terminal pad 10 is connected to an output driver of the integrated circuit, for example an output of an inverter or a tristate stage. It is also possible for the signals DQ1, DQ2 to be bidirectional signals and serve both for feeding data or analog signals to the integrated circuit and for picking them off from it.

The crossing locations of the further metal conductor track 3 and signal-carrying conductor tracks 14, 15 are to be configured in such a way that contact between the conductor track 3 carrying ground potential GND and the conductor tracks 14, 15 carrying an input/output signal is prevented. On the one hand, this can be achieved by spacing the conductor tracks far from one another at the crossovers. On the other hand, an insulation material 36, 37, which is arranged between the surfaces lying opposite one another of the metallic conductor tracks 3, 15 or 14, is expedient.

After connecting the metal conductor tracks 14, 15, 16 to the terminal pads 10, 11, 12 using the bonding wires 17, 18, 19, connecting the conductor tracks 3, 16 via the bonding wire 31, and contacting the ESD protective elements 32, 33, the entire arrangement is surrounded by the package 2. Consequently, all the conductor tracks are fixed, so that the connection of the conductor tracks 14, 15, 16 of the leadframe at the end on the outside can be removed by punching.

Since an area restriction no longer applies to the protective elements 32, 33, they can instead be dimensioned for higher current-carrying capacity than in the case of an integrated form. As a result, it is possible to increase the ESD resistance in comparison with an integrated form on the semiconductor body.

I claim:

1. A semiconductor component comprising:
   a semiconductor chip including an electronic circuit configured in said semiconductor chip, said electronic circuit having a terminal for a signal to be processed, a stage connected to said terminal for the signal, a terminal for obtaining a supply potential, said terminal for obtaining the supply potential being connected to said stage, said stage being selected from a group consisting of an input stage and an output stage;
   a first conductor track running outside said semiconductor chip, said first conductor track being connected to said terminal for the signal;
   a second conductor track running outside said semiconductor chip, said second conductor track being connected to said terminal for obtaining the supply potential;
   a further conductor track running outside said semiconductor chip, said further conductor track being connected to said second conductor track, said further conductor track entirely surrounding said semiconductor chip, said further conductor track crossing said first conductor track, defining a crossing location, and said further conductor track crossing said second conductor track; and
   an electrostatic discharge protection element for carrying an electrostatic discharge away from said terminal for the signal and to the supply potential, said electrostatic discharge protection element being disposed outside of said semiconductor chip, said electrostatic discharge protection element being connected outside of said semiconductor chip between said further conductor track and said first conductor track, said electrostatic discharge protection element being disposed close to said crossing location.

2. The semiconductor component according to claim 1, further comprising:
   a package surrounding said semiconductor chip and said further conductor track;
   said package partially surrounding said first conductor track such that a portion of said first conductor track facing toward said semiconductor chip runs inside said package and a portion of said first conductor track facing away from said semiconductor chip runs outside said package; and
   said package partially surrounding said second conductor track such that a portion of said second conductor track facing toward said semiconductor chip runs inside said package and a portion of said second conductor track facing away from said semiconductor chip runs outside said package.

3. The semiconductor component according to claim 1, wherein:
   said electrostatic discharge protection element is a diode;
   said diode has an anode connected to said further conductor track; and
   said diode has a cathode connected to said first conductor track.

4. The semiconductor component according to claim 1, further comprising an insulation material configured where said further conductor track crosses said first conductor track.

5. The semiconductor component according to claim 1, further comprising:
   a third conductor track;
   a terminal for a signal and assigned to said third conductor track; and
   a further electrostatic discharge protection element;
   said further conductor track running in a main direction and having a conductor track portion branching away from said main direction;

said third conductor track crossing said further conductor track near said conductor track portion of said further conductor track, defining a further crossing location; and said conductor track portion of said further conductor track is connected to said further electrostatic discharge protection element.

6. The semiconductor component according to claim 1, further comprising:

a bonding wire connecting said first conductor track to said terminal for the signal; and a bonding wire connecting said second conductor track to said terminal for obtaining the supply potential.

7. The semiconductor component according to claim 6, wherein said terminal for the signal and said terminal for obtaining the supply potential are metallized areas configured in said semiconductor chip.

8. The semiconductor component according to claim 1, wherein:

said input stage has at least one transistor with a gate connected to said terminal for the signal;

said transistor has a drain terminal and a source terminal;

said drain terminal or said source terminal of said transistor connected to said terminal for the supply potential.

9. The semiconductor component according to claim 8, wherein said input stage is an inverter.

10. The semiconductor component according to claim 1, further comprising a leadframe disposed outside said semiconductor chip and including said first conductor track, said first conductor track having a contact area connected to a terminal of said electrostatic discharge protection element.

11. The semiconductor component according to claim 1, wherein said first conductor track is connected to said terminal for the signal through a bonding wire.

12. The semiconductor component according to claim 5, wherein said further electrostatic discharge protection element is disposed at said further crossing location.

* * * * *